US008058716B2

(12) United States Patent
Chye et al.

(10) Patent No.: US 8,058,716 B2
(45) Date of Patent: *Nov. 15, 2011

(54) INTEGRATED CIRCUIT DEVICES WITH STACKED PACKAGE INTERPOSERS

(75) Inventors: Chew Beng Chye, Singapore (SG); Tan Kian Shing Michael, Singapore (SG); Tan Hock Chuan, Singapore (SG); Neo Chee Peng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/625,384

(22) Filed: Nov. 24, 2009

(65) Prior Publication Data

US 2010/0065955 A1 Mar. 18, 2010

Related U.S. Application Data

(63) Continuation of application No. 11/446,004, filed on Jun. 1, 2006, now Pat. No. 7,622,798.

(51) Int. Cl.
*H01L 23/02* (2006.01)
(52) U.S. Cl. ........................ 257/686; 257/784; 257/777
(58) Field of Classification Search ................ 257/686, 257/784, 777, 786, 723, 724
See application file for complete search history.

(56) References Cited

U.S. PATENT DOCUMENTS

| | | | |
|---|---|---|---|
| 7,282,793 B2 | 10/2007 | Akram | |
| 7,435,619 B2 | 10/2008 | Shim et al. | |
| 7,622,798 B2 * | 11/2009 | Chye et al. | 257/686 |
| 2003/0164550 A1 | 9/2003 | Lee et al. | |
| 2005/0104196 A1 | 5/2005 | Kashiwazaki | |

OTHER PUBLICATIONS www.statschippac.com, "Advanced 3D Package Technology" and "Standard 3D Package Solutions", Oct. 2005, 2 pages.
http://www.statschippac.com/STATSChipPAC/Preview.htm, 3D—Next Generation Packages, Jun. 1, 2006, 1 page.
Karnezos et al., "3D Packaging Promises Performance, Reliability Gains with Small Footprints and Lower Profiles", STATS ChipPAC, Fremont, CA, Jan./Feb. 2005, 4 pages.
STATS ChipPAC Package Nomenclature, Mar. 30, 2006, 4 pages.
Steven J. Adamson, "Jet Dispensing Underfills For Stacked Die Applications", Assembly Technology Expo, Sep. 28-30, 2004, Rosemont, IL, 4 pages.
Fujitsu Advanced Packaging Brochure, 2002, 32 pages.
http://www.chipscalereview.com/archives/ES/issues/0301/electronicTrends.html, Mar. 2001, 3 pages.

* cited by examiner

Primary Examiner — Sheila Clark
(74) Attorney, Agent, or Firm — Wells St. John P.S.

(57) ABSTRACT

An IC device includes a die and a first package interposer stacked over a second package interposer. The IC device includes a first conductive connection from a first bond pad of the die directly to a bond pad of the first interposer and a second conductive connection from a second bond pad of the die directly to a bond pad of the second interposer. Another IC device includes a second die stacked over a separate first die and a first package interposer stacked over a separate second package interposer. The first die is stacked over the first interposer. A first conductive connection exists from a bond pad of the first die directly to a bond pad of the first interposer and a second conductive connection exists from a bond pad of the second die directly to a bond pad of the second interposer.

19 Claims, 7 Drawing Sheets

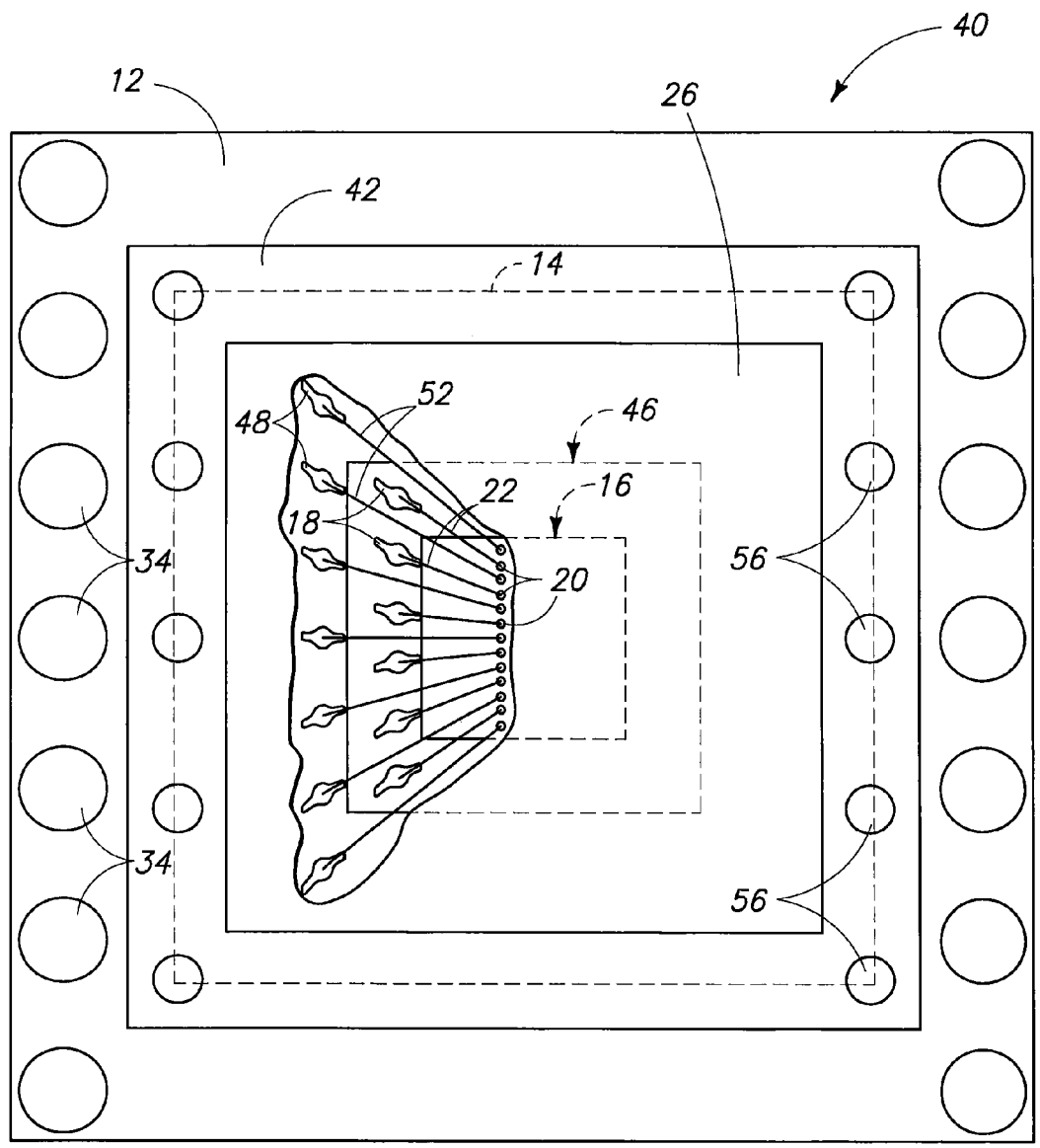
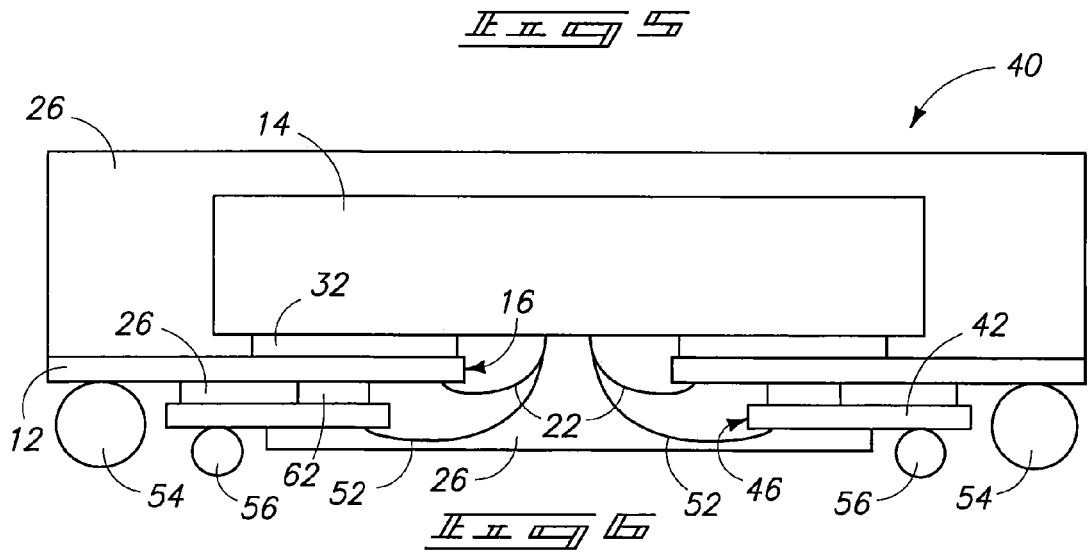

US 8,058,716 B2

INTEGRATED CIRCUIT DEVICES WITH STACKED PACKAGE INTERPOSERS

RELATED PATENT DATA

Cross Reference to Related Application

This application is a continuation of U.S. patent application Ser. No. 11/446,004, which was filed on Jun. 1, 2006 and which claims priority to Singapore Patent Application Serial No. 200602634-8, which was filed on Apr. 19, 2006 and which is incorporated herein by reference.

TECHNICAL FIELD

The invention pertains to integrated circuit (IC) devices that include multiple, stacked package interposers.

BACKGROUND OF THE INVENTION

Advancement in IC technology continues to allow reduced die sizes with increased numbers of input/output connections to the die. Dies are often housed in a package in order to electrically connect a die with outside circuitry, physically protect the die, and/or dissipate heat from the die, as well as serve other purposes. Corresponding to the reduced die sizes, IC packages containing dies may also be reduced in size, requiring smaller package substrates, whereon dies may be mounted and input/output connections made from the die to the package substrate. Given the scaling down of package substrates coupled with increased numbers of die input/output connections, a significant challenge arises for designers of package substrates. The scaling down of substrate size reduces the available area on a substrate where conductive connection may be made from the die to the substrate. Accordingly, a desire exists to allow decreased substrate sizes without decreasing as significantly the available area for conductive connections between dies and the substrate.

BRIEF DESCRIPTION OF THE DRAWINGS

Preferred embodiments of the invention are described below with reference to the following accompanying drawings.

FIG. 5 is a bottom view and

FIG. 6 is a sectional view of an IC package according to an aspect of the invention.

DETAILED DESCRIPTION OF THE PREFERRED EMBODIMENTS

Figure 1:
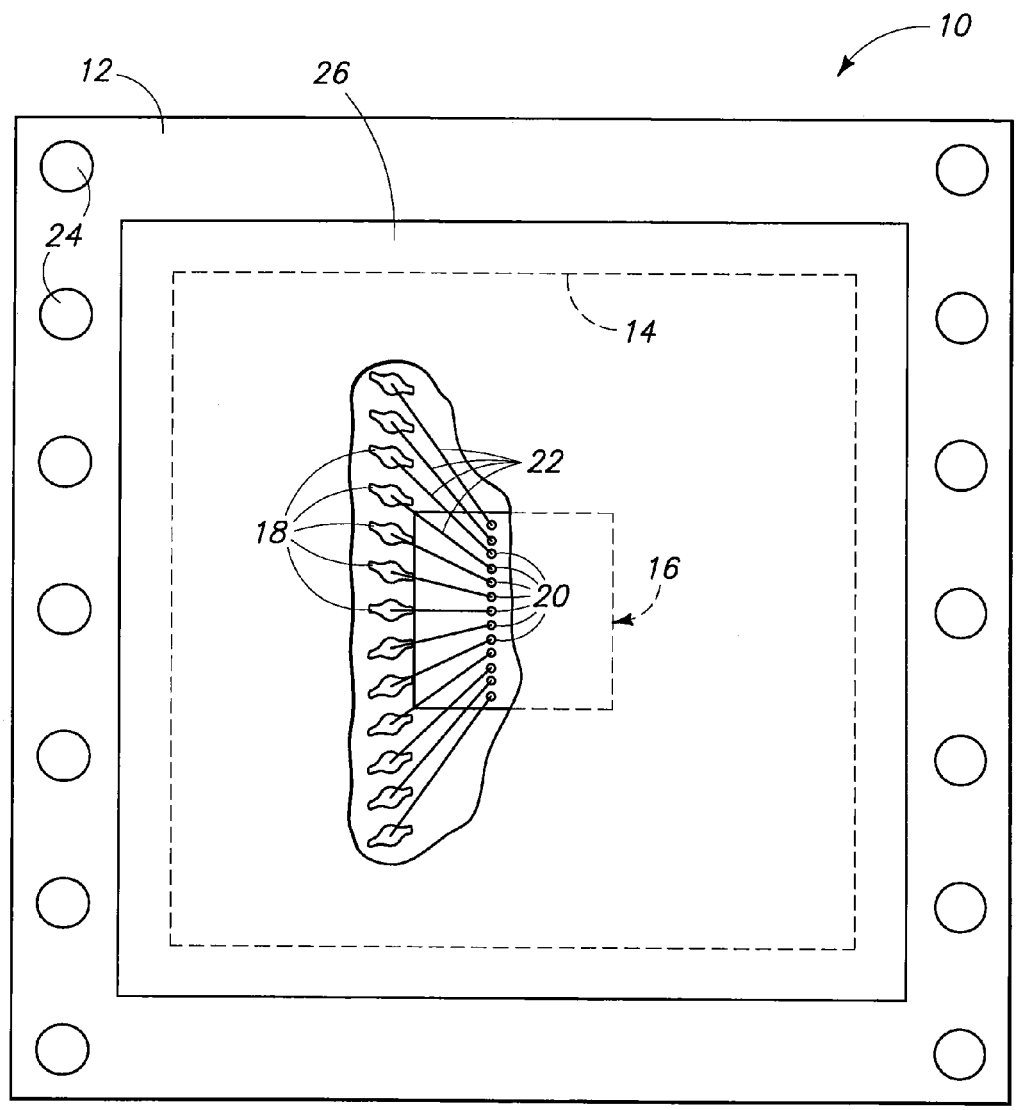
FIG. 1 is a bottom view.
Figure 2:
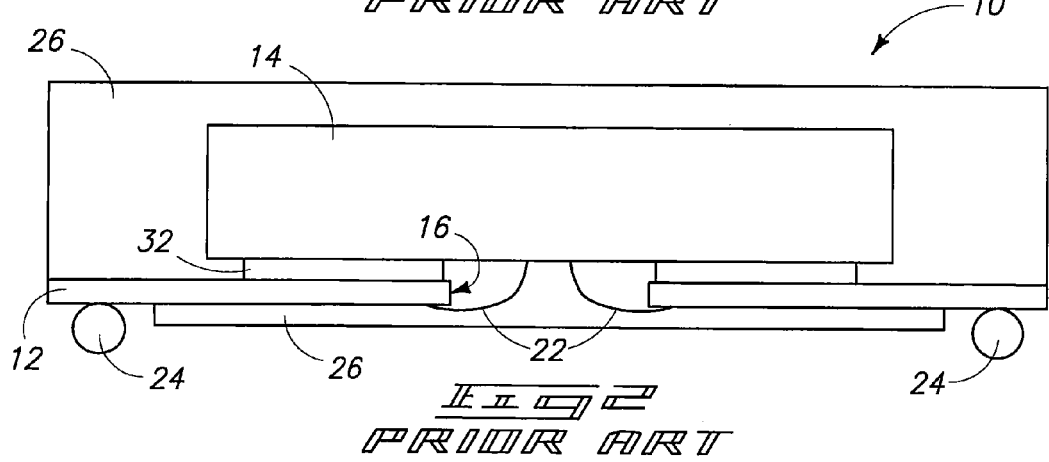
FIG. 2 is a sectional view of a conventional IC package.

FIG. 1 shows a bottom view and FIG. 2 shows a sectional view of a conventional IC package presented as exemplary chip scale packaging (CSP). CSP is characterized by a die size that is very close to the substrate size. Die size is typically defined as its two-dimension area, such as shown by the dashed lines for a substrate 14 in FIG. 1. Generally, a CSP substrate is not more than 1.2 times the size of the die. The aspects of the invention described herein are not limited to use in CSP. However, CSP constitutes one possible application in which the potential advantages are readily apparent. Given the description herein, those of ordinary skill can appreciate that the aspects of the invention may also be applied to thin small outline packaging (TSOP), ball grid array (BGA) packaging, and potentially others.

In the context of the present document, the term "interposer" refers generically to the material whereon a die may be attached for use in an IC package. A variety of interposers that are known may be stacked in accordance with aspects of the inventions or custom interposers may be designed specially adapted to the inventions. A "substrate," commonly known in the art, refers to one type of interposer typically having a non-metallic, insulative base and metallic, conductive routing such as copper traces. A "lead frame," also commonly known in the art, refers to another type of interposer that is typically metallic and conductive. Both types may provide leads for attachment to an external device, such as a printed circuit board. Leads may also be referred to as pins. Instead of pins for external leads, an interposer may rely upon a BGA or another known type of connector. Aspects of the invention may also utilize other types of interposers.

FIGS. 1 and 2 show an IC package 10 which includes an encapsulant 26 encasing a package substrate 12, a die 14, and physical and electrical connections therebetween. Notably, portions of encapsulant 26 are shown cut away in FIG. 1 to allow a view of selected electrical connections. Die 14 contains integrated circuitry (not shown) with bond pads 20 that may be viewed through an opening 16 in FIG. 1. Opening 16 thus provides access to bond pads 20 during wire bonding processes. Package substrate 12 provides bond pads in the form of bond fingers 18 to enable input/output connection of die 14 to package substrate 12 with wires 22 that may be formed by wire bonding. Balls 24 that form a part of a BGA provide external conductive contacts from IC package 10. An adhesive 32 attaches die 14 to package substrate 12.

Figure 3:
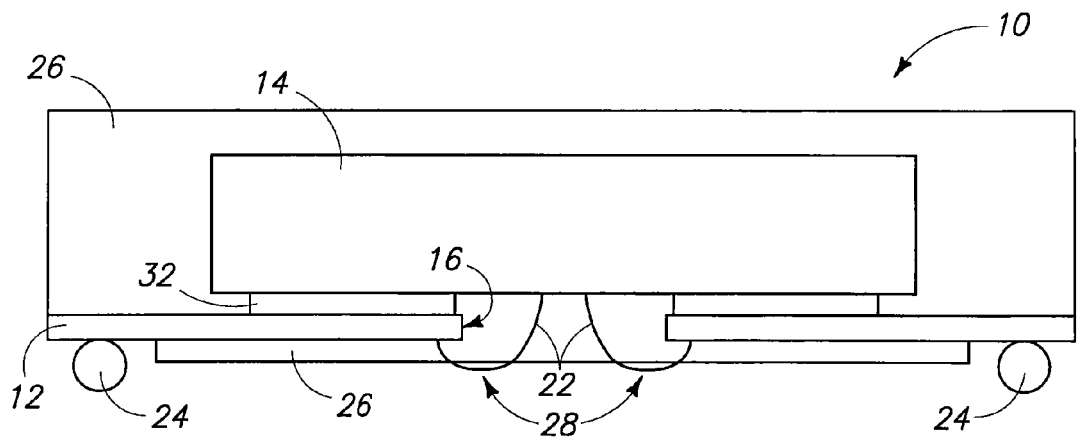
FIG. 3 is a sectional view of another conventional IC package.

As readily appreciated by those of ordinary skill, only a portion of the input/output connections between die 14 and package substrate 12 and only a portion of the external conductive contacts that would typically be present are shown. The simplified features allow clearer explanation of problems encountered in conventional packaging. Similarly, FIG. 3 showing other problems with conventional packaging and FIGS. 5-9 showing aspects of the invention are simplified and/or provide cut-away views. Aspects of the invention are not necessarily limited to the specific dimensions shown in the figures. However, as may be appreciated from the aspects of the inventions described herein, certain advantages and benefits may be realized from enumerated size ratios, positions, and/or orientations of components. Some specific dimensions may inherently be more conducive than others to providing the desired positions and/or orientations. In addition, aspects of the invention are not limited to completed IC packages, such as shown in the figures. Aspects of the invention also apply to IC devices that are intermediate constructions within the process of forming completed IC packages.

As shown in FIG. 1, a large wire angle of wires 22 with respect to the edges of die 16 may result from decreased sizes of dies and increased numbers of input/output connections. The large wire angle increases the potential for a wire 22 from one of bond fingers 18 to short circuit to an adjacent bond finger 18. Given the close proximity shown in FIG. 1 of some wires 22 to adjacent bond fingers, even a minor misalignment of components could result in a short circuit. To increase the margin of error in processing and to avoid such wire shorting, the vertical clearance between a wire and the substrate may be increased. FIG. 3 shows wires 22 with increased clearance from package substrate 12. However, increasing clearance in such manner may result in exposed wires 28 extending out from or near the surface of encapsulant 26, as shown in FIG. 3. Exposed or nearly exposed wires can result in package failures. Accordingly, increasing clearance between wires 22 and package substrate 12 may not produce acceptable results in some applications.

Figure 4:
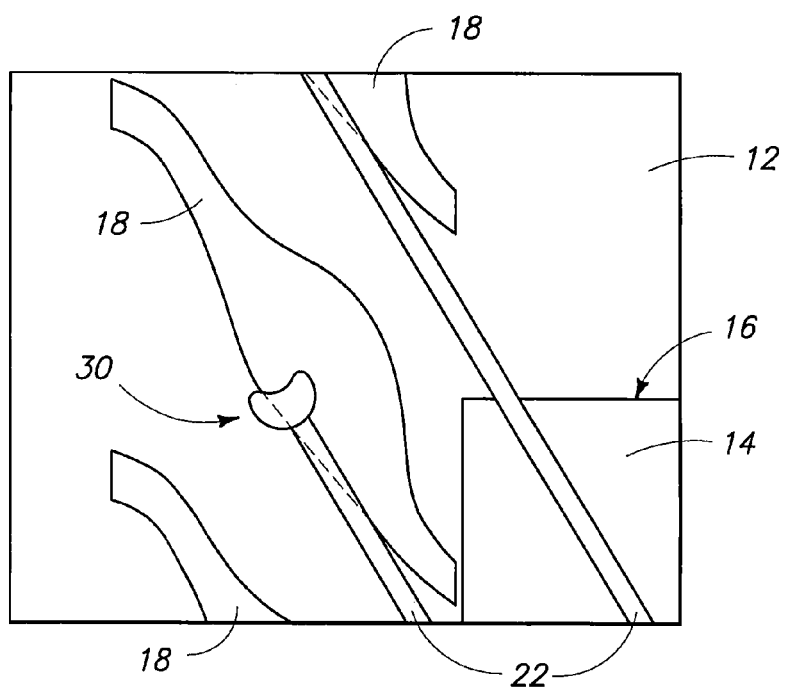
FIG. 4 is an enlarged view of wire connections to bond fingers in a conventional IC package.

FIG. 4 shows an enlarged view of wires 22 bonded to bond fingers 18 at a stitch 30. Notably, the wire material in stitch 30 flares outward in the bonding process, as is conventionally known. However, reduced sizes of bond pads, such as bond fingers 18, may result from increasing numbers of input/output connections in packaging. Accordingly, stitch 30 is shown in FIG. 4 as overhanging bond finger 18. Even though conductive contact is made between wires 22 and bond fingers 18 in FIG. 4, an overhanging stitch flare is below industrial standards for manufacture of IC packages. The flare of a wire stitch where bonded to a bond pad is expected to be entirely encompassed within a bond pad. A stitch flare overhanging beyond a bond pad may create a reliability problem, decrease the pull strength of a wire bond, and could unattach during subsequent manufacturing or use. As is readily apparent from FIG. 1, enlargement of bond fingers 18 to reduce the problem of overhanging stitch flare is not acceptable given the limited area available on package substrate 12.

Accordingly, aspects of the invention described herein use multiple, stacked interposers in particular configurations to increase the limited area available on package interposers. A variety of known packages are available that include multiple substrates and/or multiple dies. However, no known packages use multiple interposers and/or multiple dies in a manner that increases the area available for input/output connections between a die and the interposers by using the additional interposers to address the problems described herein.

In one aspect of the invention, an IC device includes a die containing an integrated circuit with a first and a second bond pad. The device includes a first package interposer stacked over a second package interposer, the first interposer including a bond pad at an elevational level with respect to the die which is different from an elevational level of a bond pad included in the second interposer. The IC device includes a first conductive connection from the die's first bond pad directly to the first interposer's bond pad and a second conductive connection from the die's second bond pad directly to the second interposer's bond pad. Accordingly, since bond pads are provided at multiple elevational levels, an increased area may be provided for input/output connections from the die to the interposer. Even if total available area does not actually increase (or even decreases), the utilized area exists at different elevations, which may assist in separating otherwise crowded connections.

By way of example, features associated with other aspects of the inventions described herein might be used with the present aspect of the invention to the extent they do not conflict. In the present aspect of the invention, the die may be attached to the first interposer with a nonconductive adhesive. The first interposer may also be attached to the second interposer with a nonconductive adhesive. Further, the sole conductive connections from the die to the first and second interposers may include wires. Examples of a nonconductive adhesive include double sided tape and/or paste. The die may be stacked over the first interposer, thus forming a die/first interposer/second interposer stack, which may or may not include other components therebetween. Further interposers and/or dies may be included in the device as well. The relative sizes of the first interposer and second interposer may be selected to accomplish a variety of structural features. For example, the first interposer may have a larger size than the second interposer and the device may further include a first BGA under the first interposer and a second BGA under the second interposer. The first and second BGAs may form external conductive contacts from the respective first and second interposers.

In the present aspect of the invention, at least one die has conductive connections to multiple interposers. The IC device may include multiple dies, which may or may not also have conductive connections to multiple interposers. For example, the second interposer may include an additional bond pad and the IC device may include an additional die containing an integrated circuit with a third bond pad. The second interposer may be stacked over the additional die and the IC device may include a third conductive connection from the additional die's third bond pad directly to the second interposer's additional bond pad. The third conductive connection between the additional die and the second interposer may include a ball of a BGA.

While it may be common in the art to provide multiple, stacked substrates, the art only provides one substrate in the stack with direct electrical contact to the die. That is, a die stacked over a conventional series of stacked substrates has electrical connections directly from the die only to the top substrate. Similarly, while it may be common in the art to provide multiple, stacked dies, the art only provides one substrate with direct electrical contact to any of the multiple dies. With multiple dies, multiple substrates, or both, underlying electrical connections between substrates may ultimately provide an electrical connection from a die to underlying substrates in a stack, but only through such electrical connections between the substrates and not directly to underlying substrates. This concept differs from aspects of the invention providing conductive connections from one or more die's bond pads directly to bond pads of multiple interposers. However, including in an IC device the direct connections described for the aspects of the invention does not necessarily preclude the inventive IC devices from further including the conventional type of contacts between interposers.

In the present aspect of the invention, the die may be separated from the first interposer solely by nonconductive material, consequently, no conductive connections exist between the die and first interposer to separate the die from the first interposer. Similarly, the first interposer may be separated from the second interposer solely by nonconductive material, thus further differentiating the conventional type of substrate stacks with electrical contacts, e.g. a BGA, separating substrates. The first and second connections described above between the die and the first and second interposers may include wires. A first opening may be provided completely through the first interposer and a second opening may be provided completely through the second interposer. The first wires may pass through the first opening and the second wires may pass through both the first and second openings.

FIGS. 5 and 6 show an IC package 40 that includes die 14 and package substrate 12 from FIGS. 1 and 2. However, FIGS. 5 and 6 show a second package substrate 42. Package substrate 12 is stacked over second package substrate 42, which includes bond pads in the form of bond fingers 48. Thus, IC package 40 provides bond fingers 48 at one elevational level and bond fingers 18 at a different elevational level. Wires 22 connect bond pads 20 on die 14 to bond fingers 18 in a similar manner to that shown in FIGS. 1 and 2, but wires 52 connect bond pads 20 of die 14 to bond fingers 48. As is apparent from FIG. 5, the stacked interposers allow more space between bond pads, helping to prevent wire shorting between adjacent bond pads. The different elevational levels of bond pads add a vertical component to the separation of wires without contributing to encapsulation problems. Notably, wire angle is essentially unchanged in FIG. 5 compared to FIG. 1. However, it will be appreciated that bond fingers 48 and 18 may be moved closer together to reduce wire angle if desired. Instead or in addition, the size of bond fingers 18 and 48 may be enlarged to prevent overhanging stitch flare. Given the increased area available for bond pads and different elevational levels, a balance between bond pad spacing, wire angle, and/or bond pad size may be selected for an optimum design.

In FIGS. 5 and 6, wires 52 pass through an opening 46 in second package substrate 42 as well as through opening 16 in package substrate 12. Opening 42 and opening 16 have square shapes and are aligned to be concentric. Other shapes and alignments are conceivable depending upon the particular die/interposer design. Adhesive 62 attaches package substrate 12 to second package substrate 42. Balls 54 of a BGA and balls 56 of a BGA provide external conductive contacts from IC package 40. The larger size of package substrate 12 compared to second package substrate 42 accommodates having a BGA on both interposers, though larger balls are used on package substrate 12 to accommodate the elevation difference. Smaller balls may be used on package substrate 12 by employing other known ball attach techniques to achieve a suitable standoff height. The positions and/or orientations of components in IC package 40 allow improved flexibility in locating conductive connections, whether external or internal (within the encapsulant).

Encapsulant 26 encases the package in a manner such that die 14 is separated from package substrate 12 solely by adhesive 32 and encapsulant 26. Both materials may be nonconductive. Similarly, package substrate 12 is separated from second package substrate 42 solely by adhesive 62 and encapsulant 26. Thus, the stack including die 14, package substrate 12, and second package substrate 42 includes wires 22 and 52 as the sole conductive connections from die 14 to package substrate 12 and second package substrate 42.

According to another aspect of the invention, an IC device includes a first die containing an integrated circuit with a bond pad, a second die containing an integrated circuit with a bond pad, and a first package interposer stacked over a separate second package interposer and separated from the second package interposer solely by nonconductive material. Each interposer includes a bond pad. The IC device has a first conductive connection from the first die's bond pad directly to the first interposer's bond pad and a second conductive connection from the second die's bond pad directly to the second interposer's bond pad.

By way of example, features associated with other aspects of the inventions described herein might be used with the present aspect of the invention to the extent they do not conflict. In addition, still other features may be used with the present aspect of the invention. According to one feature, the first die may be stacked over the first interposer and the second die may be stacked over the first die. As another feature, the first die and the second interposer may both include an additional bond pad and the device may include a third conductive connection from the first die's additional bond pad directly to the second interposer's additional bond pad. The first interposer's bond pad may be at an elevational level with respect to the first die which is different from an elevational level of the second interposer's bond pad. The nonconductive material may contain adhesive and encapsulant. The IC device may further include a first opening completely through the first interposer and a second opening completely through the second interposer and aligned with the first opening. The first wires may pass through the first opening.

Figure 7:
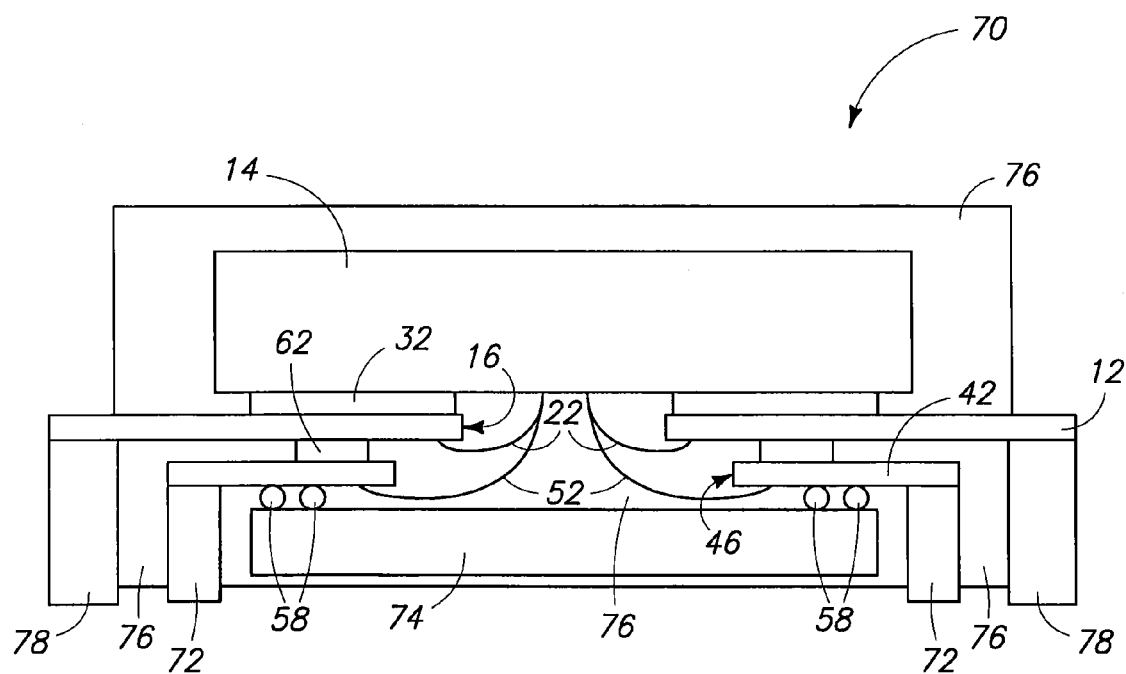
FIG. 7 is a sectional view of an IC package according to another aspect of the invention.

Turning to FIG. 7, IC package 70 is shown in sectional view including many of the same features as shown in FIG. 6 for IC package 40. However, IC package 70 shows second package substrate 42 stacked over a die 74. Although not readily apparent from FIG. 7, second package substrate 42 includes additional bond pads that contact balls 58 of a BGA forming a conductive connection between the bond pads (not shown) of die 74 and the bond pads of second package substrate 42. Balls 58 also physically attach die 74 to second package substrate 42. Given the increased thickness of IC package 70 in comparison to IC package 40, balls 54 and balls 56 of IC package 40 are replaced, respectively, with column bump 78 and column bump 72. Similarly, an encapsulant 76 replaces encapsulant 26 of IC package 40 to encase the additional features. IC package 70 thus provides one example of incorporating multiple types of conductive connections between a die and a package interposer, making further use of portions of second package substrate 42 suitable for bond pads.

In a further aspect of the invention, an IC device includes a second die stacked over a separate first die and a first package interposer stacked over a separate second package interposer. Each die contains an integrated circuit with a bond pad. Each interposer includes a bond pad. The first die is stacked over the first interposer. A first conductive connection exists from the first die's bond pad directly to the first interposer's bond pad and a second conductive connection exists from the second die's bond pad directly to the second interposer's bond pad.

By way of example, features associated with other aspects of the inventions described herein might be used with the present aspect of the invention to the extent they do not conflict. The second die may be attached to the first die with a nonconductive adhesive, the first die may be attached to the first interposer with nonconductive adhesive, and the first interposer may be attached to the second interposer with nonconductive adhesive. Further, the sole conductive connections from the first and second dies to the respective first and second interposers may include wires. The first interposer may have a smaller size than the second interposer. The device may further include a BGA under the second interposer, forming external conductive contacts from the second interposer.

The first interposer's bond pad may be at an elevational level with respect to the first die which is different from an elevational level of the second interposer's bond pad. The first die may be separated from the first interposer solely by nonconductive material. The device may further include a first opening completely through the first interposer and second opening completely through the second interposer and aligned with the first opening. Formed as a wire, the first conductive connection may pass through the first opening.

Even though the first interposer may be separated from the second interposer solely by nonconductive material, the first interposer and the second interposer may each include an additional bond pad. The device may further include a third conductive connection from the first interposer's additional bond pad directly to the second interposer's additional bond pad, allowing increased flexibility in designing circuits on the interposers.

Figure 8:
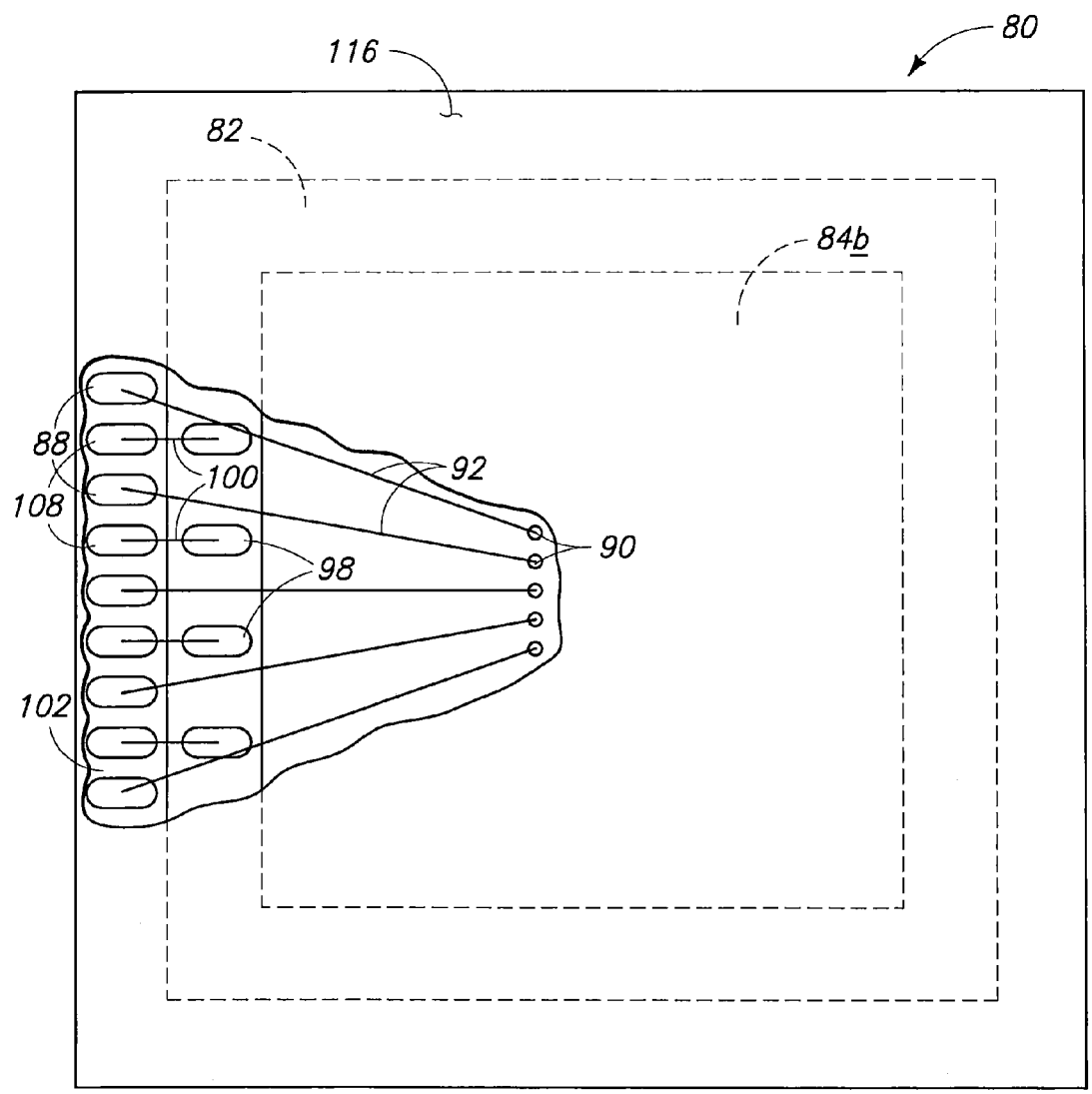
FIG. 8 is a top view.
Figure 9:
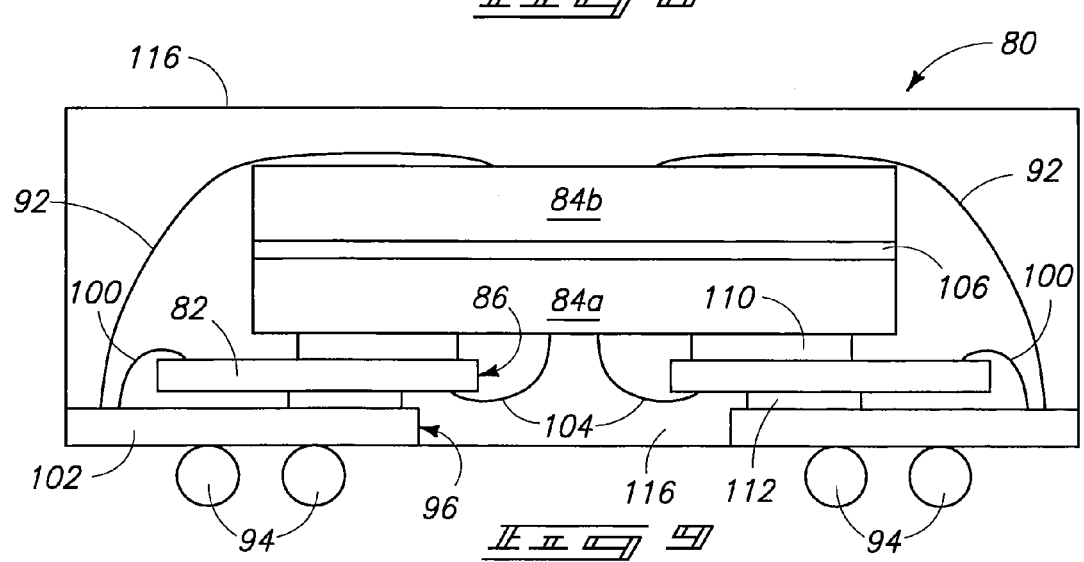
FIG. 9 is a sectional view of an IC package according to a further aspect of the invention.

FIGS. 8 and 9 show a top view and a sectional view of an IC package 80. A die 84b is stacked over a die 84a. Dies 84a and 84b are attached with adhesive 106, which may be nonconductive. Die 84a is stacked over first package substrate 82 which is, in turn, stacked over second package substrate 102. An adhesive 110 between die 84a and first package substrate 82 and an adhesive 112 between first package substrate 82 and second package substrate 102 may be nonconductive. Wires 104 provide conductive connections from bond pads (not shown) of die 84a directly to bond pads (not shown) of first package substrate 82 in a manner similar to wires 22 in FIGS. 5 and 6. Wires 104 pass through an opening 86 completely through first package substrate 82. An opening 96 completely through second package substrate 102 provides access to the bond pad during wire bonding.

In the top view of FIG. 8, die 84b is shown with bond pads 90, second package substrate 102 is shown with bond pads 88 and 108 and first package substrate 82 is shown with bond pads 98. Wires 92 connect bond pads 90 of die 84b to bond pads 88 of second package substrate 102. Thus die 84a has a conductive connection to one of the stacked interposers and die 84b has a conductive connection to another of the stacked interposers. An increased area for bond pads is provided by first package substrate 82 and second package substrate 102 for a multiple die stack in comparison to other IC packages that use a single substrate or provide direct conductive connection from a die stack only to a single substrate. In the event that it is desired, wires 100 may also provide a conductive connection directly from bond pads 108 of second package substrate 102 to bond pads 98 of first package substrate 82. IC package 80 thus enables significant flexibility in package design. An encapsulant 116 encases the dies and interposers while balls 94 of a BGA form external conductive contacts from the package.

FIGS. 5-9 provide a few examples of how a stack of multiple interposers may be used along with a single die or multiple dies to accommodate increased input/output connections. In addition to the advantages mentioned herein, an increased area for bond pad placement may allow use of larger wire diameters. Larger wire diameters, in turn, increase the margin of error during encapsulation when wire sweep may be a problem. Larger wire diameters provide increased structural support for wires so that wires remain correctly aligned during packaging. In addition to potentially larger bond pads, the increased interposer area may also allow wider traces between bond pads and other circuitry on the package interposer. Wider traces can improve reliability.

Even though numerous advantages exist for stacked interposers of the type associated with the aspects of the invention herein, it should be understood that such stacked interposers might involve additional process steps compared to single interposers. Package height may also be somewhat higher. Further, interposer cost may be higher compared to single interposers. However, given the physical constraints associated with single interposers and associated with stacked interposers only enabling direct conductive connections from dies to one interposer, such potential disadvantages are much less significant compared to the potential advantages described herein.

Another advantage of various aspects of the invention may include enabling an increase in unit output per hour (UPH) of the manufacturing process. In the conventional circumstance where bond pads are reduced in size, a bond placement locator feature of a wire bonder may be activated to achieve better placement accuracy. Activating the locator feature may improve accuracy, but it also may decrease UPH given the extra processing time needed. Aspects of the invention that allow larger bond pad size may correspondingly allow processing with the locator feature deactivated. Thus, aspects of the invention may allow an increase in UPH along with accurate bond placement.

Figure 10:
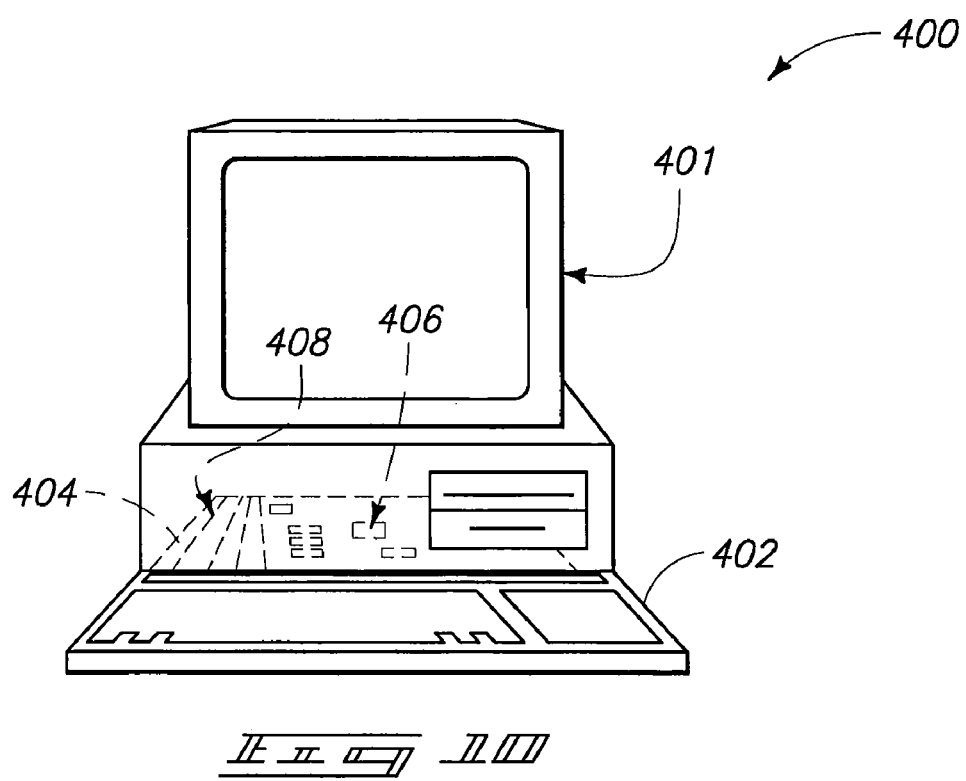
FIG. 10 is a diagrammatic view of a computer illustrating an exemplary application of the present invention.
Figure 11:
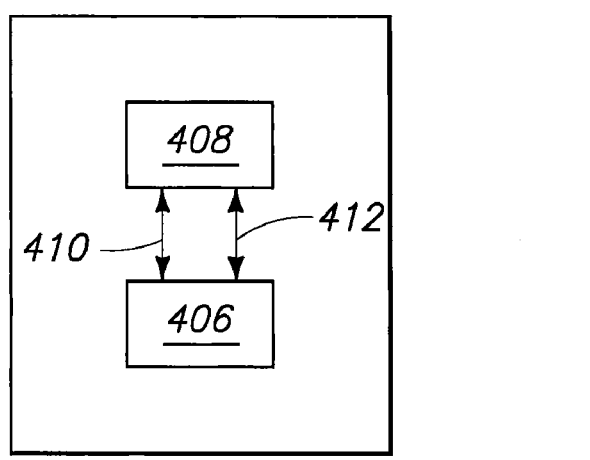
FIG. 11 is a block diagram showing particular features of the motherboard of the FIG. 14 computer.

FIG. 10 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 11. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation that utilizes the teachings of the present invention. The memory device can be incorporated into any of a variety of designs that provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory that allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 12:
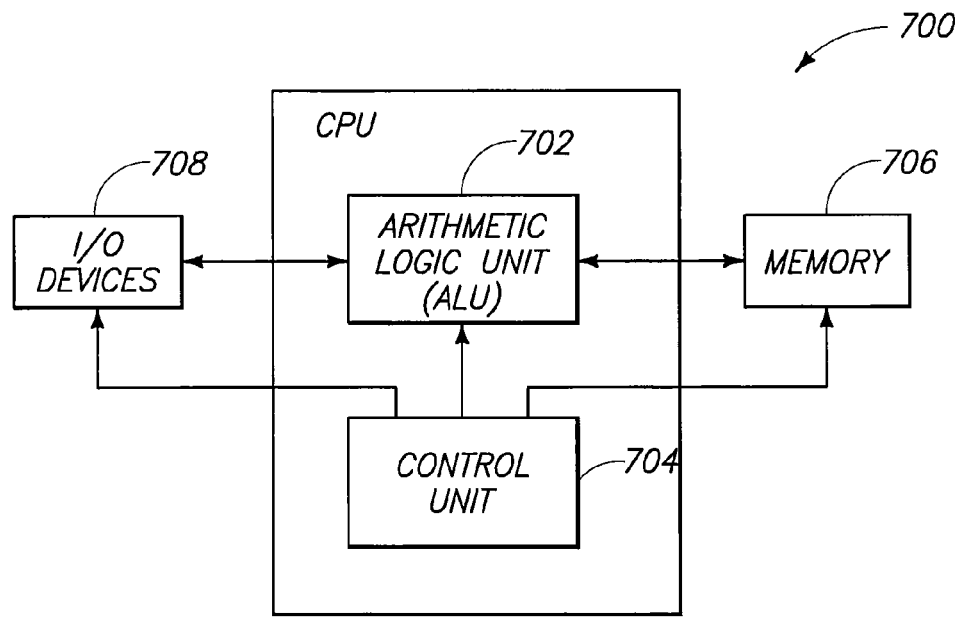
FIG. 12 is a high level block diagram of an electronic system according to an exemplary aspect of the present invention.

FIG. 12 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells.

Figure 13:
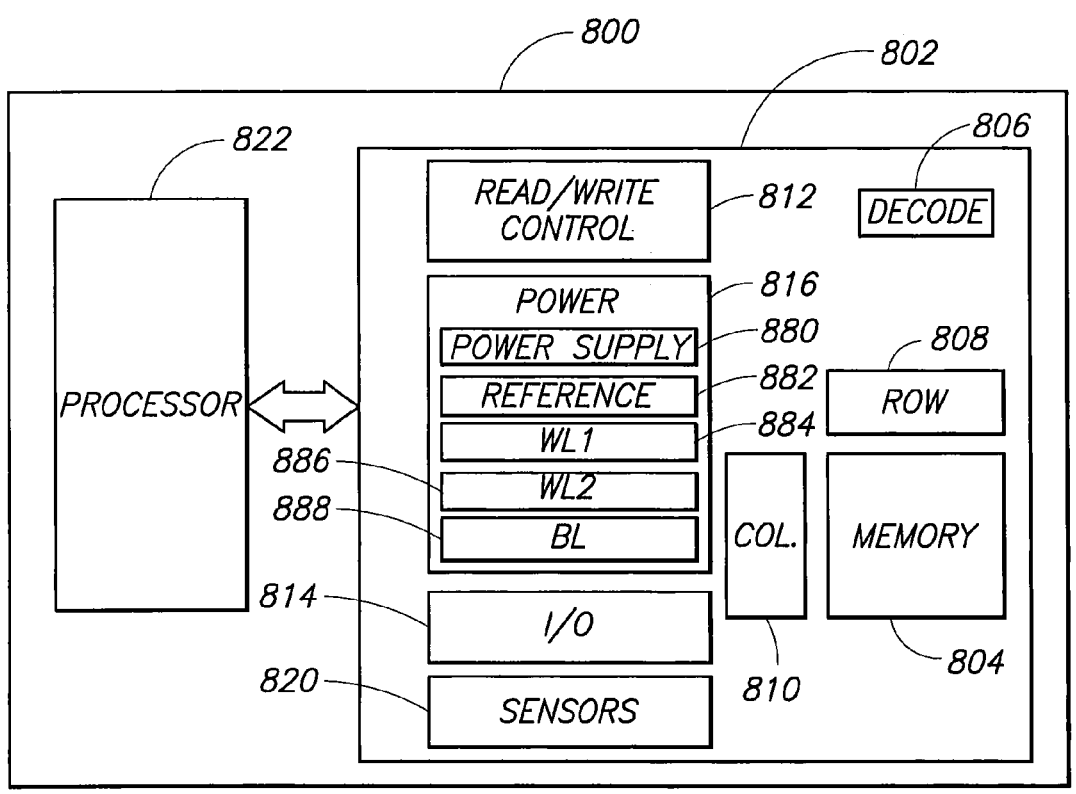
FIG. 13 is a simplified block diagram of an exemplary memory device.

FIG. 13 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first word-line with pulses, circuitry 886 for providing the second word-line with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data that is accessed via I/O lines. It will be appreciated by those skilled in the art that additional circuitry and control signals can be provided, and that the memory device 802 has been simplified to help focus on the invention.

The various illustrated systems of this disclosure are intended to provide a general understanding of various applications for the IC devices of the present invention, and are not intended to serve as a complete description of all the elements and features of an electronic system using memory cells. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. An integrated circuit device comprising:
a die containing an integrated circuit with a first and a second bond pad;
a first package interposer stacked over and attached with nonconductive adhesive to a separate second package interposer and separated from the second interposer solely by nonconductive material, the die being stacked over and attached with nonconductive adhesive to the first interposer and separated from the first interposer solely by nonconductive material, the first interposer including a bond pad at an elevational level with respect to the die which is different from an elevational level of a bond pad included in the second interposer; and
a first conductive wire from the die's first bond pad directly to the first interposer's bond pad and a second conductive wire from the die's second bond pad directly to the second interposer's bond pad.

2. The device of claim 1 wherein the sole conductive connections from the die to the first and second interposers comprise wires.

3. The device of claim 1 wherein the first interposer has a larger size than the second interposer, the device further comprising a first BGA under the first interposer and a second BGA under the second interposer, the first and second BGAs forming external conductive contacts from the respective first and second interposers.

4. The device of claim 1 wherein the second interposer includes an additional bond pad, the device further comprising:
an additional die containing an integrated circuit with a third bond pad, the second interposer being stacked over the additional die; and
a conductive connection from the additional die's third bond pad directly to the second interposer's additional bond pad.

5. The device of claim 4 wherein the conductive connection comprises a ball of a BGA.

6. The device of claim 1 further comprising a first opening completely through the first interposer and a second opening completely through the second interposer, the first wires passing through the first opening and the second wires passing through both the first and second openings.

7. An integrated circuit device comprising:
a first die containing an integrated circuit with a bond pad;
a second die containing an integrated circuit with a bond pad;
a first package interposer stacked over a separate second package interposer and separated from the second interposer solely by nonconductive material, each interposer including a bond pad, the first die being stacked over and attached with nonconductive adhesive to the first interposer and separated from the first interposer solely by nonconductive material, and the second interposer being stacked over the second die; and
a conductive wire from the first die's bond pad directly to the first interposer's bond pad and a conductive connection from the second die's bond pad directly to the second interposer's bond pad, the second die being attached to the second interposer by a BGA that includes the conductive connection.

8. The device of claim 7 wherein the sole conductive connections from the first die to the first interposer comprise wires.

9. The device of claim 7 wherein the first interposer has a larger size than the second interposer, the device further comprising a first array of conductive column bumps under the first interposer and a second array of conductive column bumps under the second interposer, the first and second arrays forming external conductive contacts from the respective first and second interposers.

10. The device of claim 7 wherein first die and the second interposer both include an additional bond pad, the device further comprising an additional conductive wire from the first die's additional bond pad directly to the second interposer's additional bond pad.

11. The device of claim 10 wherein the first interposer's bond pad is at an elevational level with respect to the first die which is different from an elevational level of the second interposer's additional bond pad.

12. The device of claim 7 wherein the nonconductive material comprises adhesive and encapsulant.

13. The device of claim 7 further comprising a first opening completely through the first interposer and a second opening completely through the second interposer and aligned with the first opening, the wire passing through the first opening.

14. An integrated circuit device comprising:
a second die stacked over and attached with nonconductive adhesive to a separate first die, each die containing an integrated circuit with a bond pad;
a first package interposer stacked over and attached with nonconductive adhesive to a separate second package interposer and separated from the second interposer solely by nonconductive material, each interposer including a bond pad and the first die being stacked over and attached with nonconductive adhesive to the first interposer and separated from the first interposer solely by nonconductive material; and
a first conductive wire from the first die's bond pad directly to the first interposer's bond pad and a second conductive wire from the second die's bond pad directly to the second interposer's bond pad.

15. The device of claim 14 wherein the sole conductive connections from the first and second dies to the respective first and second interposers comprise wires.

16. The device of claim 14 wherein the first interposer has a smaller size than the second interposer, the device further comprising a BGA under the second interposer forming external conductive contacts from the second interposer.

17. The device of claim 14 wherein the first interposer and the second interposer both include an additional bond pad, the device further comprising a third conductive wire from the first interposer's additional bond pad directly to the second interposer's additional bond pad.

18. The device of claim 14 wherein the first interposer's bond pad is at an elevational level with respect to the first die which is different from an elevational level of the second interposer's bond pad.

19. The device of claim 14 further comprising a first opening completely through the first interposer and a second opening completely through the second interposer and aligned with the first opening, the first wire passing through the first opening.

* * * * *